United States Patent [19]
Tedham et al.

[11] Patent Number: 4,872,733
[45] Date of Patent: Oct. 10, 1989

[54] MULTI-POSITION BASE FOR SUPPORTING A CABINET

[75] Inventors: Thomas A. Tedham, Salem; See C. Leung, Tewksbury, both of Mass.

[73] Assignee: Wang Laboratories, Inc., Lowell, Mass.

[21] Appl. No.: 291,802

[22] Filed: Dec. 29, 1988

[51] Int. Cl.[4] .............................................. A47B 91/00
[52] U.S. Cl. .................................... 312/255; 312/253; 248/293
[58] Field of Search ................................ 312/253–255; 248/293

[56] References Cited
U.S. PATENT DOCUMENTS
1,810,855 6/1931 Rockmore ...................... 312/255 X
1,997,640 4/1935 Huff ................................... 312/253

Primary Examiner—Joseph Falk
Attorney, Agent, or Firm—Michael H. Shanahan; Kenneth L. Milik

[57] ABSTRACT

A cabinet base supports such a cabinet, providing stabilizing legs extending outward to prevent tipping. The stabilizing legs can be pivoted into four configurations permitting the cabinet to be installed with either of its broad sides against a wall or free standing away from any wall. In its fourth configuration the base has a compact envelope advantageous for shipping or storage. The base is easily changed from one configuration to another, and is inexpensive to make.

5 Claims, 4 Drawing Sheets

MULTI-POSITION BASE FOR SUPPORTING A CABINET

BRIEF SUMMARY OF THE INVENTION

The invention relates to supporting a cabinet such as are used to house a personal computer. Such cabinets frequently are rather thin and are desirably positioned on the floor or other support surface in a vertical position. So positioned the cabinet is easily tipped over.

The cabinet base of the invention supports such a cabinet, providing stabilizing legs extending outward to prevent tipping. The stabilizing legs can be pivoted into four configurations permitting the cabinet to be installed with either of its broad sides against a wall or free standing away from any wall. In its fourth configuration the base has a compact envelope advantageous for shipping or storage. The base is easily changed from one configuration to another, and is inexpensive to make.

DETAILED DESCRIPTION

Figure 2:
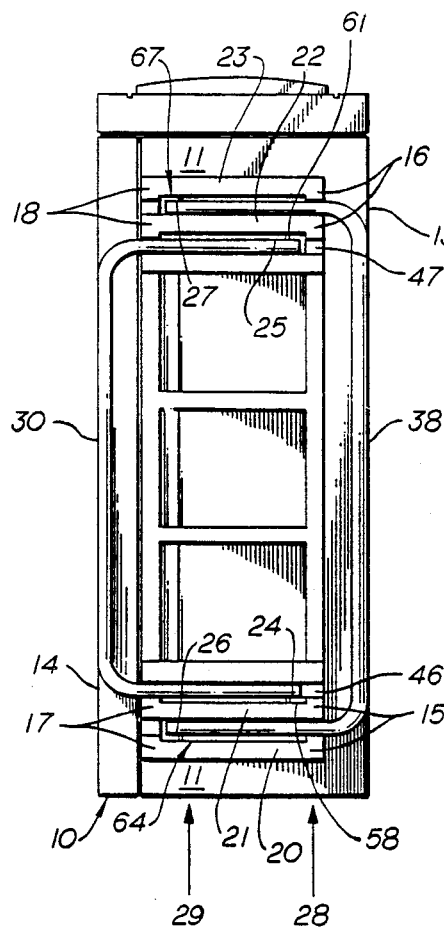
FIG. 2 shows a bottom view of the cabinet base of FIG. 1 with both stabilizing legs in the inboard position.
Figure 1:
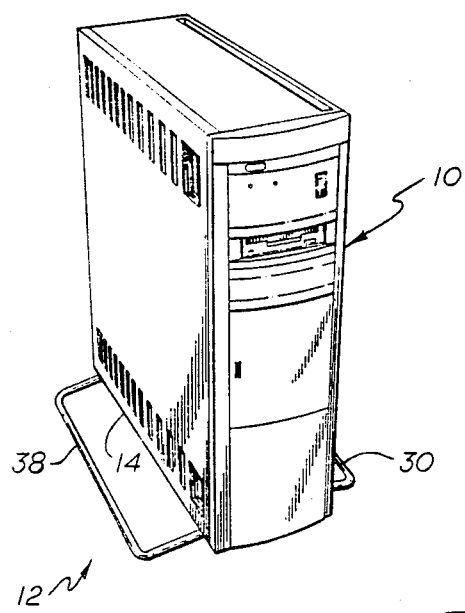
FIG. 1 shows in perspective view a cabinet supported in the free standing position on a cabinet base according to the invention.
Figure 5:
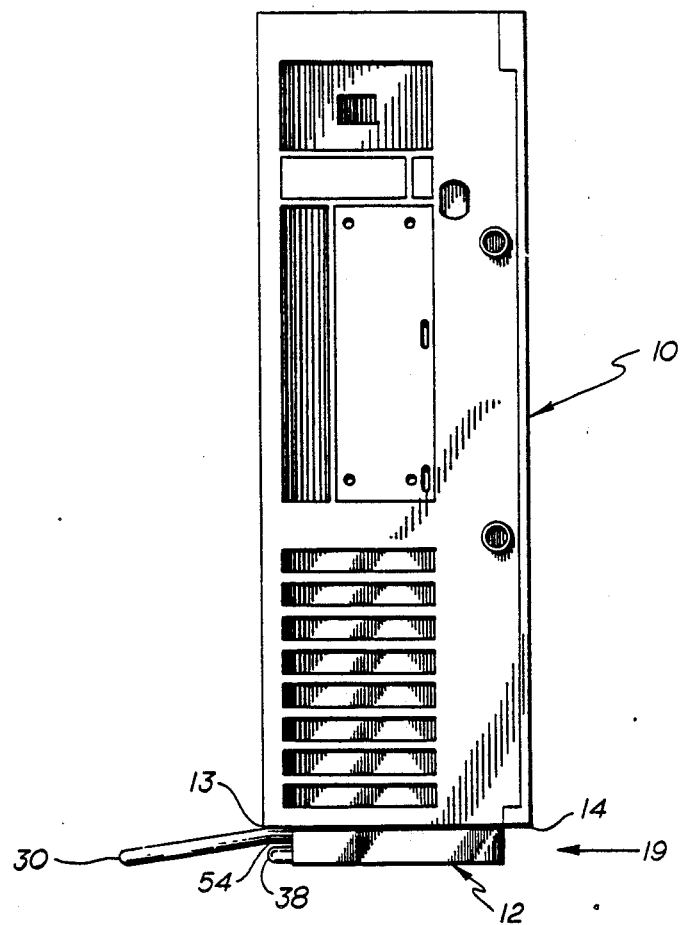
FIG. 5 shows a front view of the cabinet and cabinet base of FIG. 1 with one stabilizing leg in the outboard position and the other stabilizing leg in the inboard position.
Figure 3:
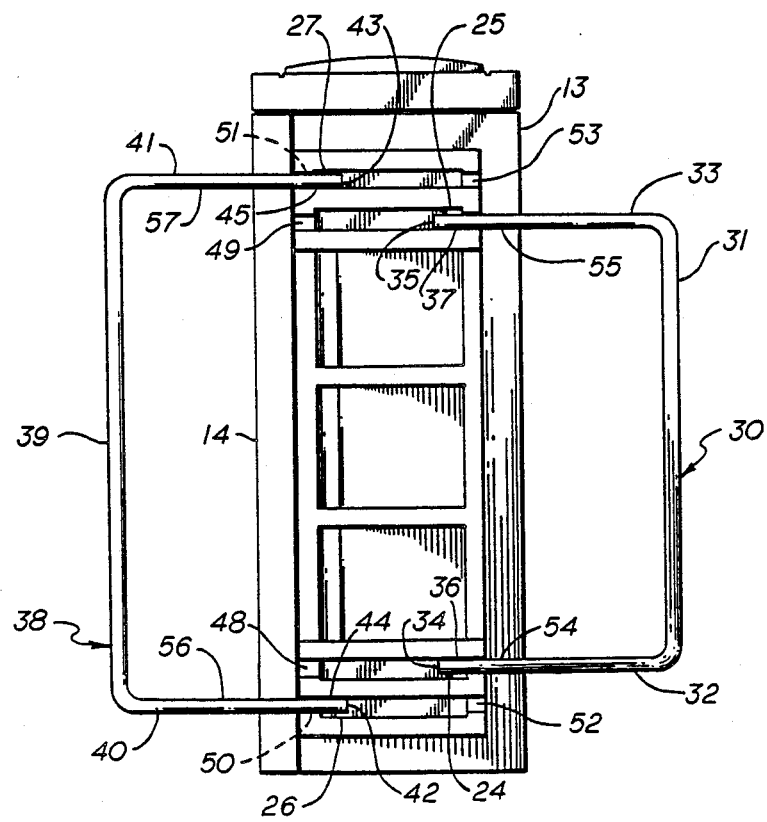
FIG. 3 shows a bottom view of the cabinet base of FIG. 1 with both stabilizing legs in the outboard position.
Figure 4:
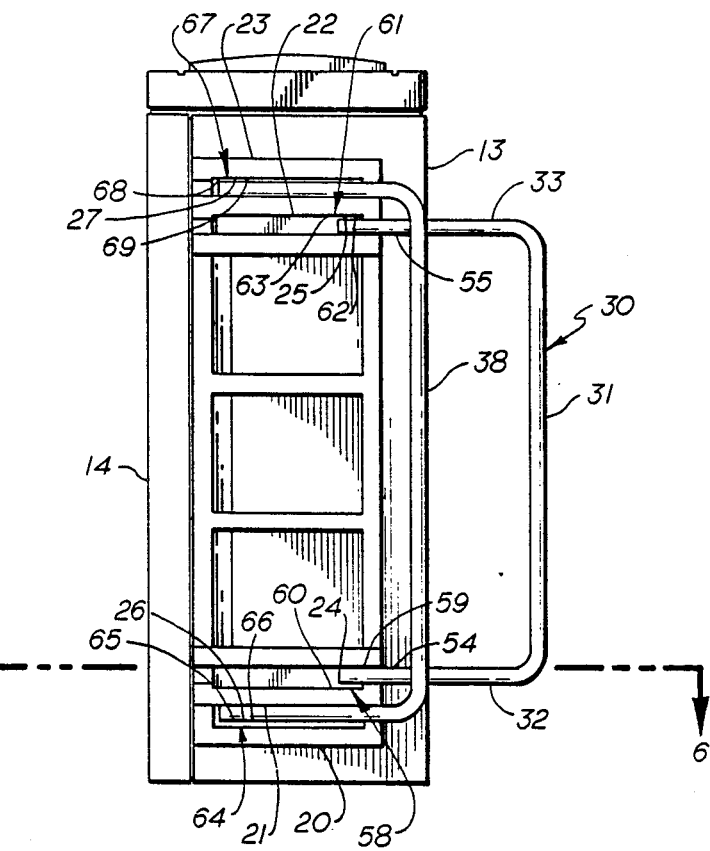
FIG. 4 shows a bottom view of the cabinet base of FIG. 1 with one stabilizing leg in the outboard position and the other stabilizing leg in the inboard position.

Referring to the Figures, cabinet 10 made of polymeric material and with horizontal bottom surface 11 is supported on cabinet base 12 according to the invention. Bottom surface 11 is bounded in part by a first edge 13, and a second edge 14 parallel thereto. Cabinet 10 is rather flat so that edge 13 and edge 14 are over twice as long as the distance separating them.

Transverse ridges 20, 21, 22, 23 are integrally molded with cabinet 10 and provide four cabinet support areas 15, 16, 17, and 18, which are positioned in a plane 19 below cabinet bottom surface 11, one support surface being near each end of edges 13, 14.

Figure 6:
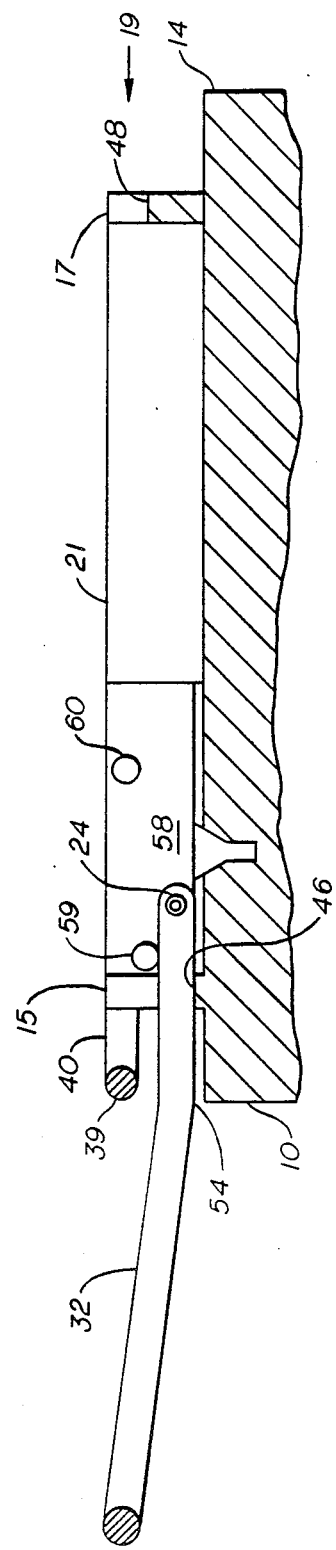
FIG. 6 shows a portion of a section on plane 6—6 of FIG. 4 particularly showing a detail of a pivot and bosses which are parts of the cabinet base of FIG. 1.

Fitting 58, shown particularly in FIG. 6, is affixed to cabinet 10 adjacent to ridge 21 and carries pivot pin 24 and bosses 59 and 60. Fitting 61, a mirror image of fitting 58, is affixed to cabinet 10 adjacent to ridge 22 and carries pivot pin 25 and bosses 62, and 63. Pivot pins 24 and 25 have a common axis 28, which is substantially closer to edge 13 than to edge 14. Fitting 64, identical to fitting 61, is affixed to cabinet 10 adjacent to ridge 20 and carries pivot pin 26 and bosses 65 and 66. Fitting 67, identical to fitting 58, is affixed to cabinet 10 adjacent to ridge 23 and carries pivot pin 27 and bosses 68 and 69. Pivot pins 26 and 27 have a common axis 29, which is substantially closer to edge 14 than to edge 13. Pins 24, 25 are positioned such that they project onto the common axis of pins 26, 27 between pins 26, 27.

First stabilizing leg 30 is formed from a length of metal rod stock in a U-shape with a center section 31 and end sections 32, 33. The distal ends 34, 35 of sections 32, 33 are pierced with pivot holes 36, 37 which engage pivot pins 24, 25, permitting leg 30 to pivot about axis 28. Second stabilizing leg 38 is formed from a length of metal rod stock in a U-shape with a center section 39 longer than center section 31 of leg 30 and end sections 40, 41. Distal ends 42, 43 of sections 40, 41 are pierced with pivot holes 44, 45 which engage pivot pins 26, 27, permitting leg 38 to pivot about axis 29.

The path of the legs in pivoting and the position of the bosses are such that the bosses protrude into the path of the end sections of the legs, so that the legs must elastically flex to pass the bosses.

First outboard support bearings 46, 47 are integrally molded with cabinet 10 and positioned below cabinet bottom surface 11, support bearing 46 being positioned between pivot pin 24 and edge 13, and support bearing 47 being positioned between pivot pin 25 and edge 13. First inboard support bearings 48, 49 are integrally molded with cabinet 10 and positioned below cabinet bottom surface 11, support bearing 48 being positioned between pivot pin 24 and edge 14, and support bearing 49 being positioned between pivot pin 25 and edge 14. Second outboard support bearings 50, 51 are integrally molded with cabinet 10 and positioned below cabinet bottom surface 11, support bearing 50 being positioned between pivot pin 26 and edge 14, and support bearing 51 being positioned between pivot pin 27 and edge 14. Second inboard support bearings 52, 53 are integrally molded with cabinet 10 and positioned below cabinet bottom surface 11, support bearing 52 being positioned between pivot pin 26 and edge 13, and support bearing 53 being positioned between pivot pin 27 and edge 13.

First stabilizing leg 30 is pivotable about axis 28 from an outboard position in which its center section extends outboard of edge 13 and its end sections 32, 33 bear on first outboard bearings 46, 47 to an inboard position in which its center section lies inboard of edge 14 and its end sections 32, 33 bear on first inboard bearings 48, 49. Second stabilizing leg 38 is pivotable about axis 29 from an outboard position in which its center section extends outboard of edge 14 and its end sections 40, 41 bear on second outboard bearings 50, 51 to an inboard position in which its center section lies inboard of edge 13 and its end sections 40, 41 bear on second inboard bearings 52, 53.

Each of end sections 32, 33, 40, 41 of stabilizing legs 30, 38 has an offset bend 54, 55, 56, 57 respectively. As shown particularly in FIG. 6 for end section 32 of leg 30, the bend provides clearance between end section 32 of leg 30 and center section 39 of leg 38 when leg 30 is in its outboard position and leg 38 is in its inboard position by permitting end section 32 to pass over center section 39.

The shape and dimensions of end sections 32, 33, 40, 41, the positions of pivot pins 24, 25, 26, 27, and the positions of support bearings 46, 47, 48, 49, 50, 51, 52, 53 are such that the center section of each leg is positioned to be tangent to the plane 19 of the support areas 15, 16, 17, 18 when the legs are in either their inboard or outboard positions. As a result, the cabinet may be stably supported with its bottom horizontal in a free standing position away from any wall by placing both legs in their outboard positions, or with a bottom edge against a wall by placing one of the legs in its outboard position and its other leg in its inboard position. With both legs in their inboard position, the cabinet base provides a compact envelope for shipping or storage. The bosses are positioned to bias the legs into their inboard or outboard positions so that the legs will not flap around while the cabinet is being moved.

We claim:

1. A cabinet base for supporting a cabinet with a horizontal bottom surface, said horizontal bottom surface being bounded in part by a first edge and a second edge parallel thereto, said first and second edges having at least twice the length of that distance which separates them, said cabinet base comprising four cabinet support areas affixed to said cabinet and positioned below said cabinet bottom surface in a plane with each of said cabinet support areas near an end of said edges, a first pair of pivot pins affixed to said cabinet with a common first axis parallel to said first and second edges and spaced below said bottom, said first axis being substantially closer to said first edge than to said second edge, a second pair of pivot pins affixed to said cabinet with a common second axis parallel to said second and first edges and spaced below said bottom, said second axis bein substantially closer to said second edge than to said first edge, pivot pins of said first pair of pivot pins being positioned such that they project onto said second axis between the pivot pins of the second pair of pivot pins, a first stabilizing leg formed into a U-shape, with a center section and two end sections, distal ends of said two end sections being pierced with pivot holes which engage the pivot pins of said first pair of pivot pins, permitting pivoting of said said first stabilizing leg about said first axis, a second stabilizing leg formed into a U-shape, with a center section and two end sections, distal ends of said two end sections being pierced with pivot holes which engage the pivot pins of said second pair of pivot pins, permitting pivoting of said said second stabilizing leg about said second axis, the center section of said second leg being longer than the center section of said first leg, two first outboard support bearings affixed to and spaced from said cabinet horizontal bottom surface, said first outboard support bearings being positioned respectively between the pivot pins of said first pair of pivot pins and said first edge, two first inboard support bearings affixed to and spaced from said cabinet horizontal bottom surface, said first inboard support bearings being positioned respectively between the pivot pins of said first pair of pivot pins and said second edge, the end sections of said first stabilizing leg being so shaped and dimensioned, and said first outboard support bearings being so spaced above said plane that said first stabilizing leg is pivotable between an outboard position in which it bears upon said first outboard support bearings and its center section lies above and touching said plane and extended outboard from said first edge and an inboard position in which it bears upon said first inboard support bearings and its center section lies above and touching said plane and adjacent to said second edge, two second outboard support bearings affixed to and spaced from said cabinet horizontal bottom surface, said second outboard support bearings being positioned respectively between the pivot pins of said second pair of pivot pins and said second edge, two second inboard support bearings affixed to and spaced from said cabinet horizontal bottom surface, said second inboard support bearings being positioned respectively between the pivot pins of said second pair of pivot pins and said first edge, the end sections of said second stablizing leg being so shaped and dimensioned, and said second outboard support bearings being so spaced above said plane that said second stabilizing leg is pivotable between an outboard position in which it bears upon said second outboard support bearings and its center section lies above and touching said plane and extended outboard from said second edge and an inboard position in which it bears upon said second inboard support bearings and its center section lies above and touching said plane and adjacent to said first edge, the two end sections of said first stabilizing leg having offset bends positioning the end sections of the first stabilizing leg above the center section of the second stabilizing leg when said first stabilizing leg is in its outboard position and the second stabilizing leg is in its inboard position, whereby with said first stabilizing leg in its said outboard position and said second stabilizing leg is in its said outboard position, said cabinet base provides stable support for said cabinet with said bottom surface horizontal, when said cabinet is removed from any wall, with said first stabilizing leg in its said inboard position and said second stabilizing leg is in its said inboard position, said cabinet base provides stable support for said cabinet with said bottom surface horizontal, when said cabinet is positioned with its first edge against a wall, with said second stabilizing leg in its said inboard position and said first stabilizing leg in its said outboard position, said cabinet base provides stable support for said cabinet with said bottom surface horizontal, when said cabinet is positioned with its second edge against a wall, and with said first stabilizing leg in its said inboard position and with said second stabilizing leg in its said inboard position said cabinet base provides a compact envelope for shipping.

2. A cabinet base as claimed in claim 1, wherein said cabinet is made of polymeric material and said cabinet support areas and said support bearings are integrally molded therewith.

3. A cabinet base as claimed in claim 1, wherein said stabilizing legs are made from a length of metal rod stock.

4. A cabinet base as claimed in claim 1, including a boss affixed to said cabinet, said boss protruding into the path of one of said stabilizing legs as it pivots between its inboard position and its outboard position so that said one of said stabilizing legs must flex to pass said boss, said boss being positioned so that said one of said stabilizing legs is biased into one of its said inboard or outboard positions.

5. A cabinet as claimed in claim 4, including a plurality of bosses positioned so that each of said stabilizing legs is biased into each of its said inboard or outboard positions.

* * * * *